United States Patent
Terakawa et al.

(10) Patent No.: US 6,801,103 B2
(45) Date of Patent: Oct. 5, 2004

(54) NOISE FILTER

(75) Inventors: Takashige Terakawa, Kanagawa (JP); Hideyuki Yamanaka, Tokyo (JP)

(73) Assignee: EMC Inc., Tokyo (JP)

( * ) Notice: Subject to any disclaimer, the term of this patent is extended or adjusted under 35 U.S.C. 154(b) by 0 days.

(21) Appl. No.: 10/197,561

(22) Filed: Jul. 18, 2002

(65) Prior Publication Data

US 2003/0117814 A1 Jun. 26, 2003

(30) Foreign Application Priority Data

Dec. 25, 2001  (JP) ........................................ 2001-391303

(51) Int. Cl.$^7$ ................................................ H03H 7/06
(52) U.S. Cl. ........................ 333/181; 333/172; 333/174
(58) Field of Search ................................ 333/172, 174, 333/177, 181, 169

(56) References Cited

U.S. PATENT DOCUMENTS

| | | | | |
|---|---|---|---|---|
| 5,015,975 | A | 5/1991 | Okubo | ......................... 333/181 |
| 5,920,468 | A | * 7/1999 | Brisson et al. | ................. 363/39 |
| 6,075,425 | A | * 6/2000 | Gopfrich et al. | ............ 333/181 |
| 6,137,379 | A | * 10/2000 | Morrill | ......................... 333/169 |
| 6,160,461 | A | 12/2000 | Azuma et al. | ............... 333/172 |

FOREIGN PATENT DOCUMENTS

| | | | | |
|---|---|---|---|---|
| GB | 1190374 | 5/1970 | ............ H03H/7/04 |
| JP | 50127336 | 4/1974 | |
| JP | 51-58044 | 5/1976 | |
| JP | 59172822 | 9/1984 | |
| JP | 61140620 | 8/1986 | |
| JP | 1-213017 | 8/1989 | |
| JP | 3-106007 | 5/1991 | ........... H01F/17/00 |
| JP | 3-85610 | 8/1991 | |
| JP | 6-31111 | 4/1994 | |
| JP | 8-18375 | 1/1996 | |
| JP | 8-265085 | 10/1996 | |
| JP | 10164823 | 6/1998 | |

OTHER PUBLICATIONS

English Language Abstract of JP 10–164823.
English Language Abstract of JP 8–265085.
English Language Abstract of JP 1–213017.
English Language Abstract of JP 59–172822.
English Language Abstract of JP 8–18375.
English Language Abstract of JP 3–106007.

* cited by examiner

*Primary Examiner*—Robert Pascal
*Assistant Examiner*—Dean Takaoka
(74) *Attorney, Agent, or Firm*—Greenblum & Bernstein, P.L.C.

(57) ABSTRACT

A noise filter 10 of the present invention includes an inductor 71 and a resistor 11 connected in parallel with each other. A power supply frequency current bypasses the resistor 11 but passes through the inductor 71. A high frequency noise current including a resonance frequency current, on the other hand, bypasses the inductor 71 but is dissipated at the resistor 11. Therefore, the noise filter 10 does not accumulate noise power and so does not suffer from a problem due to power releasing. The resonance frequency current caused by combination of inductance of the inductance and earth capacitance in the noise filter 10 is also dissipated at the resistor 11, thus giving rise to no problem of its own.

17 Claims, 6 Drawing Sheets

*FIG.1* [1]
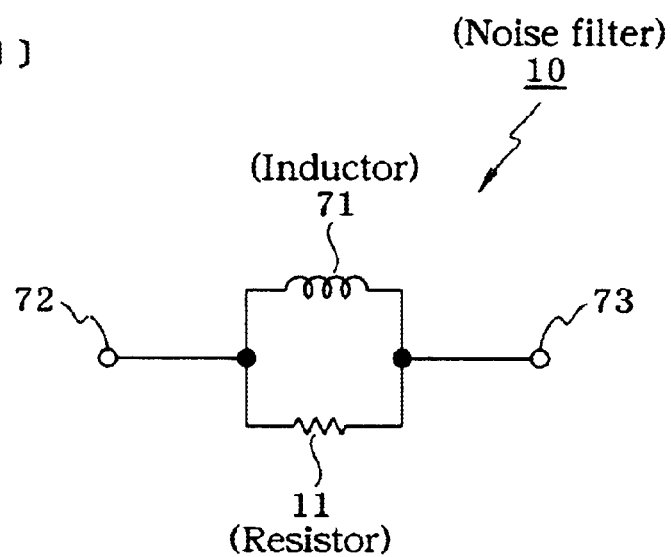
*FIG.1* [2]
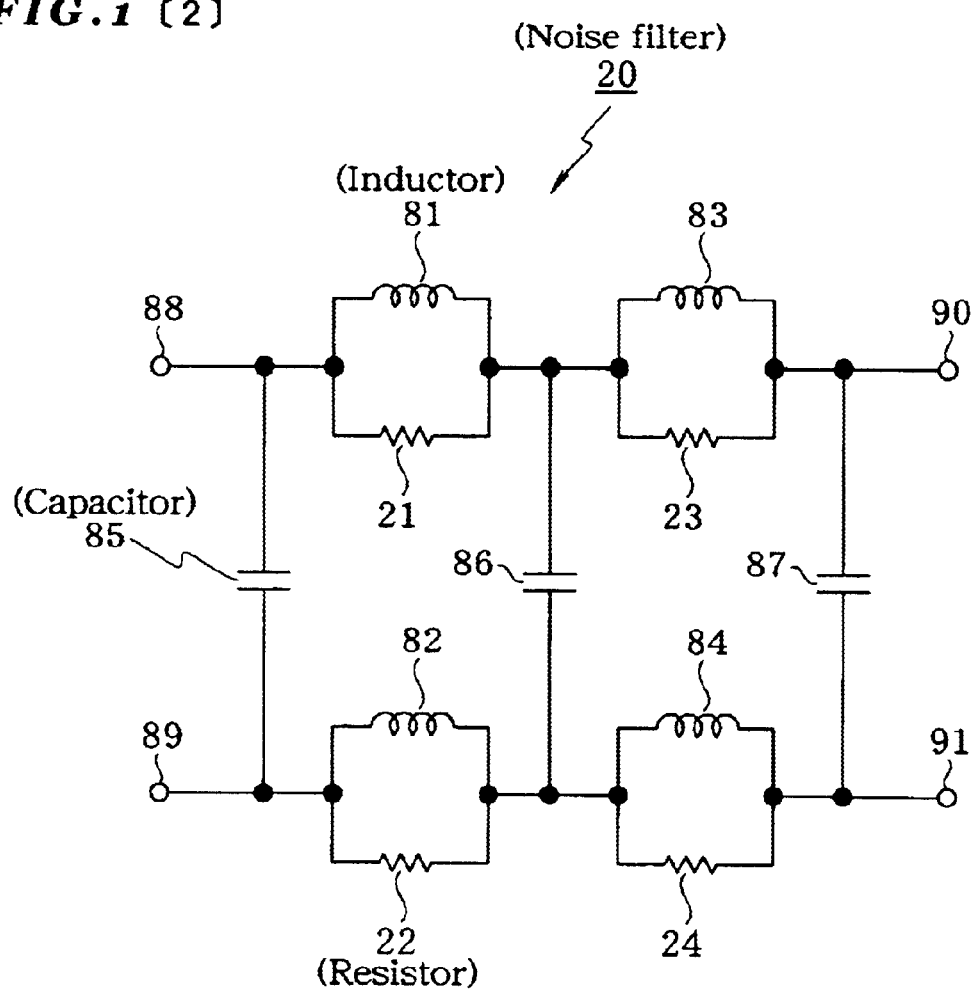

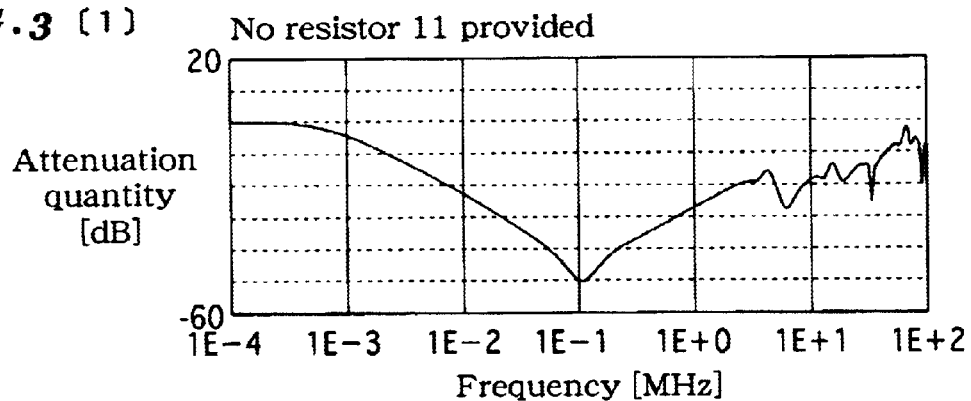
FIG.3 (1)
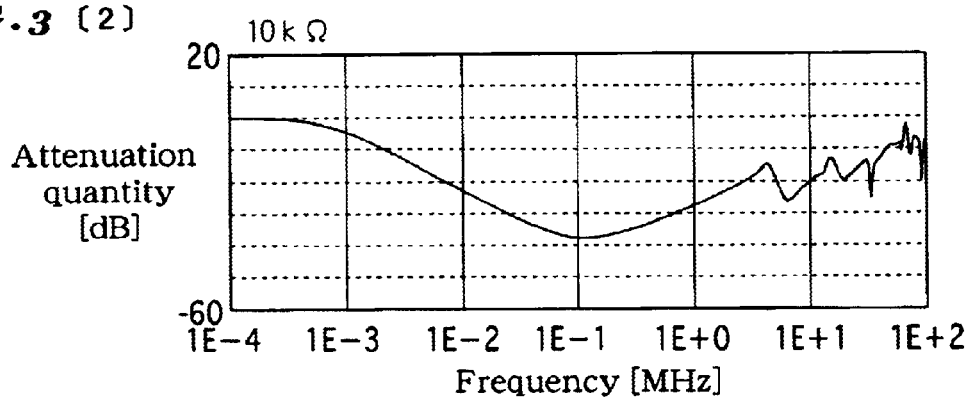
FIG.3 (2)
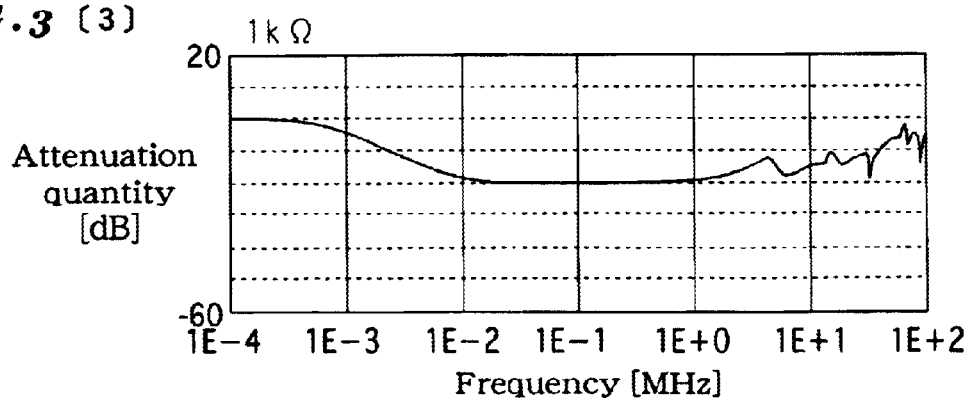
FIG.3 (3)
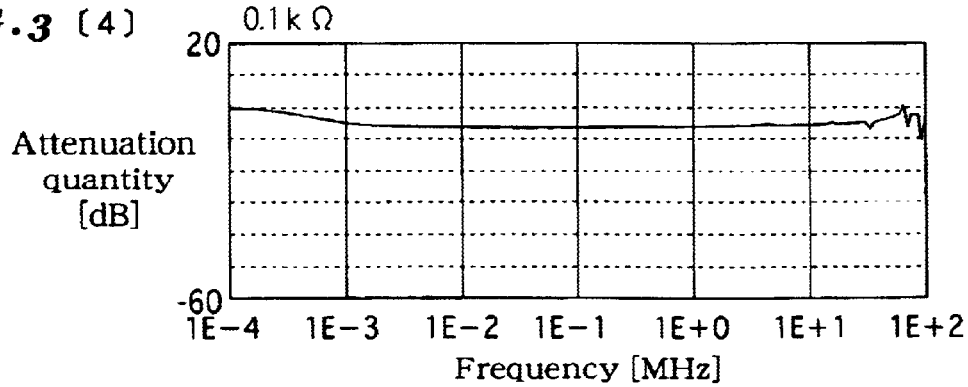
FIG.3 (4)

*FIG.4* (1)
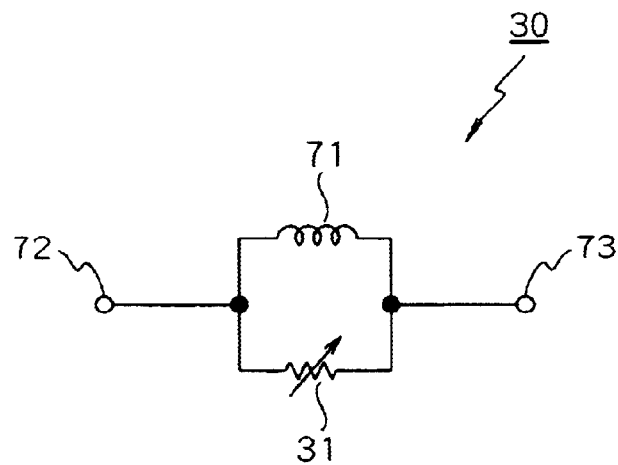
*FIG.4* (2)
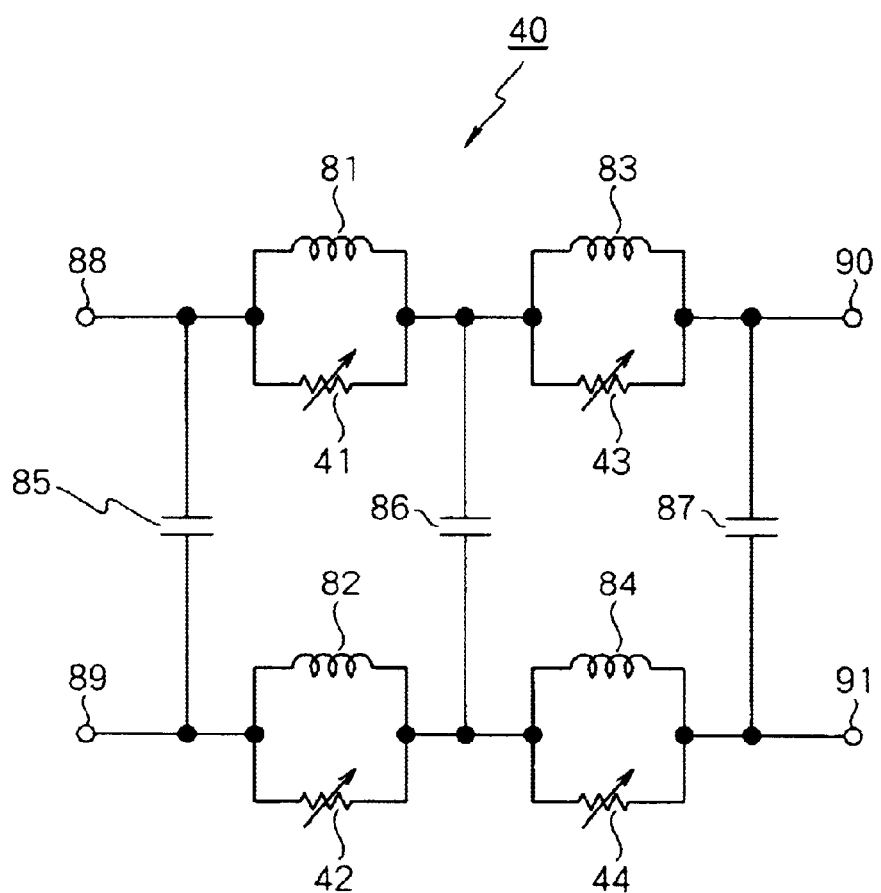

FIG. 6 (1) PRIOR ART
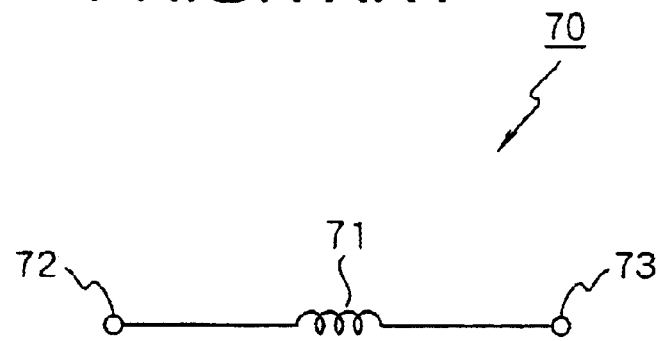
FIG. 6 (2) PRIOR ART
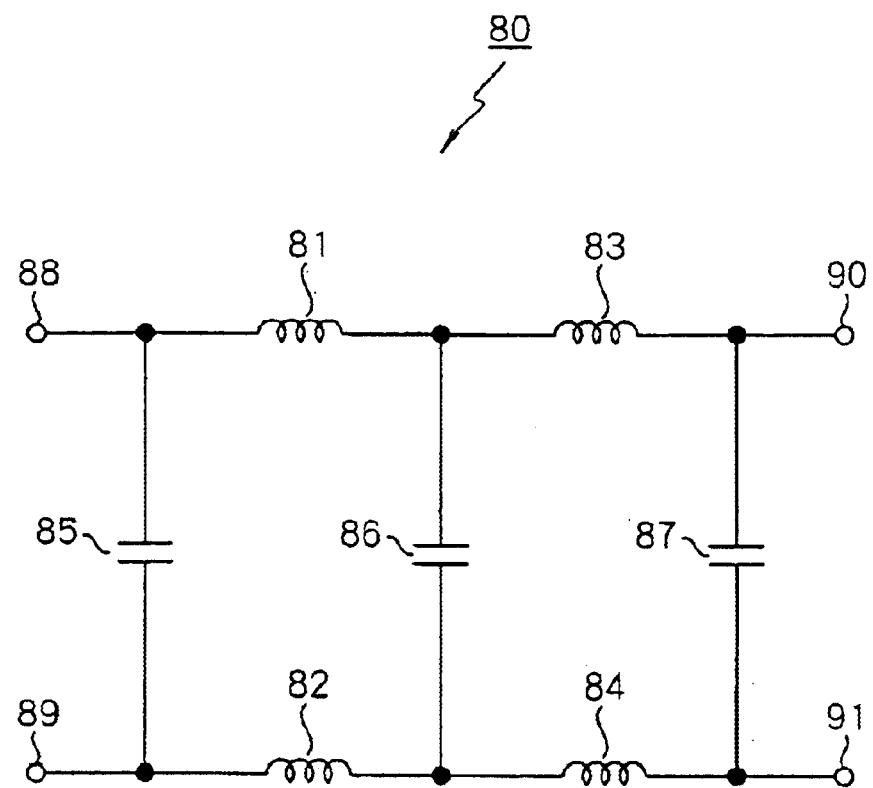

NOISE FILTER

BACKGROUND OF THE INVENTION

1. Field of the Invention

The present invention relates to a noise filter provided with an inductor which is attached to a conductor such as a power supply line or a ground line, suppresses noise induced on the conductor.

2. Description of the Related Art

A conventional noise filter comprises an inductor and a capacitor, having a function to discriminate a frequency of an undesired signal called "noise" from others to thereby pass only the signal of power supply frequencies etc. to the side of equipment. The noise has a frequency of, for example, 10 kHz or higher. The commercial power supply has a frequency of 50 or 60 Hz in Japan. Note here that in this specification the term "equipment" refers to an electric apparatus, an electric device, etc. in general.

FIG. 6 is a circuit diagram showing the conventional noise filter. The following will describe the noise filter with reference to FIG. 6.

A noise filter 70 shown in FIG. 6 is a two-terminal type noise filter for use on the ground line, comprised of one inductor 71. One terminal 72 of the two is connected to the ground and the other terminal 73, to the equipment. Also, inductance of the inductor 71 is set so that a power supply frequency current including a leakage current may be discharged from the equipment to the ground and also a noise current induced on the ground line may be blocked.

A noise filter 80 shown in FIG. 6 is a four-terminal type noise filter for use on the power supply line, comprised of four inductors 81–84 and three capacitors 85–87. Respectively, one terminals 88 and 89 are connected to the power supply and the other terminals 90 and 91, to the equipment. Also, the inductance of the inductors 81–84 and the static capacitance of the capacitors 85–87 are set so that the power supply frequency current may be flown from the power supply to the equipment and the noise current induced on the power supply line may be blocked.

The conventional noise filters, however, have the following problems.

A noise power referred to as "noise" is induced not only in a steady-state current on the power supply line or the ground line but also in a pulse-state current with non-periodically. In such a case, the inductors and capacitors of the noise filter, which accumulate power thereon owing to magnetic and electric fields respectively, release the accumulated power when noise power stops flowing thereto. As such, this released power may cause the equipment to fail or temporarily deteriorate in functioning.

In order to reduce the noise current induced on the ground line, an inductor such as a coil is used. In particular, large equipment connected to the ground line has a considerably large capacitance with respect to the ground, which may sometimes be combined with the inductance of the inductor to give rise to series resonance. A resultant resonance frequency current may flow into the equipment, thus generating a failure due to noise.

SUMMARY OF THE INVENTION

In view of the above, it is an object of the present invention to provide a noise filter which can solve a problem due to power released therefrom and a problem due to a resonance frequency current caused by combination of the inductance and the earth capacitance thereof.

The present inventor greatly engaged in researches to solve these problems and found that "a problem due to power released from a noise filter occurs if it does not have a function to dissipate a noise current (transform it into thermal energy)". The present invention is based on this finding. That is, by connecting a resistor to the noise filter in parallel with the inductor, the noise current can be dissipated at the resistor. Also, in such a circuit configuration, the resistor will act also to attenuate a series resonance current generated by combination of the capacitance-ground and the inductance. It is detailed as follows.

The noise filter according to present invention is attached to a conductor such as a power supply line or a ground line and which is provided with an inductor for suppressing noise induced on said conductor, wherein a resistor is connected in parallel with said inductor. In this configuration, the power supply current having low frequency passes through the inductor without power loss while bypassing the resistor. On the other hand, high frequency noise current including the resonance frequency current does not pass the inductor and the high frequency noise current is consumed in the resistor. Accordingly, since an electric power caused by the noise is not accumulated in the noise filter, the problem caused by discharging of the electric power is not occurred. Also, since the resonance frequency current caused by the noise filter and the earth capacitance is consumed in the resistor, the problem caused by the resonance frequency current is not occurred.

The noise filter may be configured that a parallel circuit consisting of the inductor and the resistor is attached to one ground line, with one terminal thereof connected to the ground and the other terminal thereof connected to equipment. The noise filter of this configuration is called a ground line noise filter. The number of inductors and resistors may be single or plural. When there are a plurality of inductors, a configuration of at least one inductor being connected in parallel with the resister may be acceptable.

Assuming an angular frequency of a power supply current to be $\omega p[rad]$, a lower limit angular frequency of a noise current to be $\omega n[rad]$, inductance of said inductor to be $L[H]$, and resistance of said resistor to be $R[\Omega]$, preferably a relationship of $10(\omega p \cdot L) < R < (\omega n \cdot L)/10$ is established, and more preferably a relationship of $100(\omega p \cdot L) < R < (\omega n \cdot L)/100$ is established, and most preferably a relationship of $1000(\omega p \cdot L) < R < (\omega n \cdot L)/1000$ is established. By thus narrowing a range of the value of R, it is possible to obtain well balanced characteristics that an attenuation quantity at $\omega p$ is small appropriately and that at $\omega n$ is large appropriately.

Also, a relationship of $(\omega n \cdot L)/R \geq 1/(2\omega n)$ may be established. In this case, the power dissipated at the resistor exceeds the power accumulated on the inductor.

When the power supply line is provided more than one, the noise filter may be configured that the parallel circuit consisting of the inductor and the resistor is provided to each of the power supply lines and a capacitor is provided between the power supply lines. The noise filter of this configuration is called a noise filter for use on a power supply line. The number of inductors and resistors may be single or plural. When there are a plurality of inductors, a configuration of at least one inductor being connected in parallel with the resister may be acceptable.

The resistor may be a variable resistor. As the noise filter is attached to various units of equipment, they have fluctuations in value of the earth capacitance. The resultant fluctuations in resonance frequency can also be accommodated properly by changing the resistance of the variable resistors.

The noise filter may have a configuration that the inductor is a toroidal coil, the resistor is a variable resistor, the parallel circuit consisting of the toroidal coil and the variable resistor is housed in a frame, the variable resistor is arranged in a space surrounded by an inner peripheral wall of the toroidal coil, and resistance varying means for varying resistance of the variable resistor is provided at such a position as to be able to be operated from an outside of the frame. By operating the resistance varying means from the outside of the frame, fluctuations in value of the earth capacitance can be easily accommodated. Also, since the variable resistor is arranged in the space surrounded by the inner peripheral wall of the toroidal coil, the space in the frame can be utilized effectively.

BRIEF DESCRIPTION OF THE DRAWINGS

FIG. 1 is a circuit diagram for showing a noise filter according to a first embodiment of the present invention;

FIG. 1 is a circuit diagram for showing the noise filter according to a second embodiment of the present invention;

Of FIG. 3 for showing attenuation characteristics of the noise filter of FIG. 1, FIG. 3 shows a state where $R=\infty$, FIG. 3 shows a state where $R=10$ k$\Omega$, FIG. 3 shows a state where $R=1$ k$\Omega$, and FIG. 3 shows a state where $R=0.1$ k$\Omega$;

FIG. 4 is a circuit diagram for showing the noise filter according to a third embodiment of the present invention;

FIG. 4 is a circuit diagram for showing the noise filter according to a fourth embodiment of the present invention;

FIG. 6 is a circuit diagram for showing a first example of a conventional noise filter and FIG. 6, a second example.

DESCRIPTION OF THE PREFERRED EMBODIMENTS

First Embodiment

Figure 2:
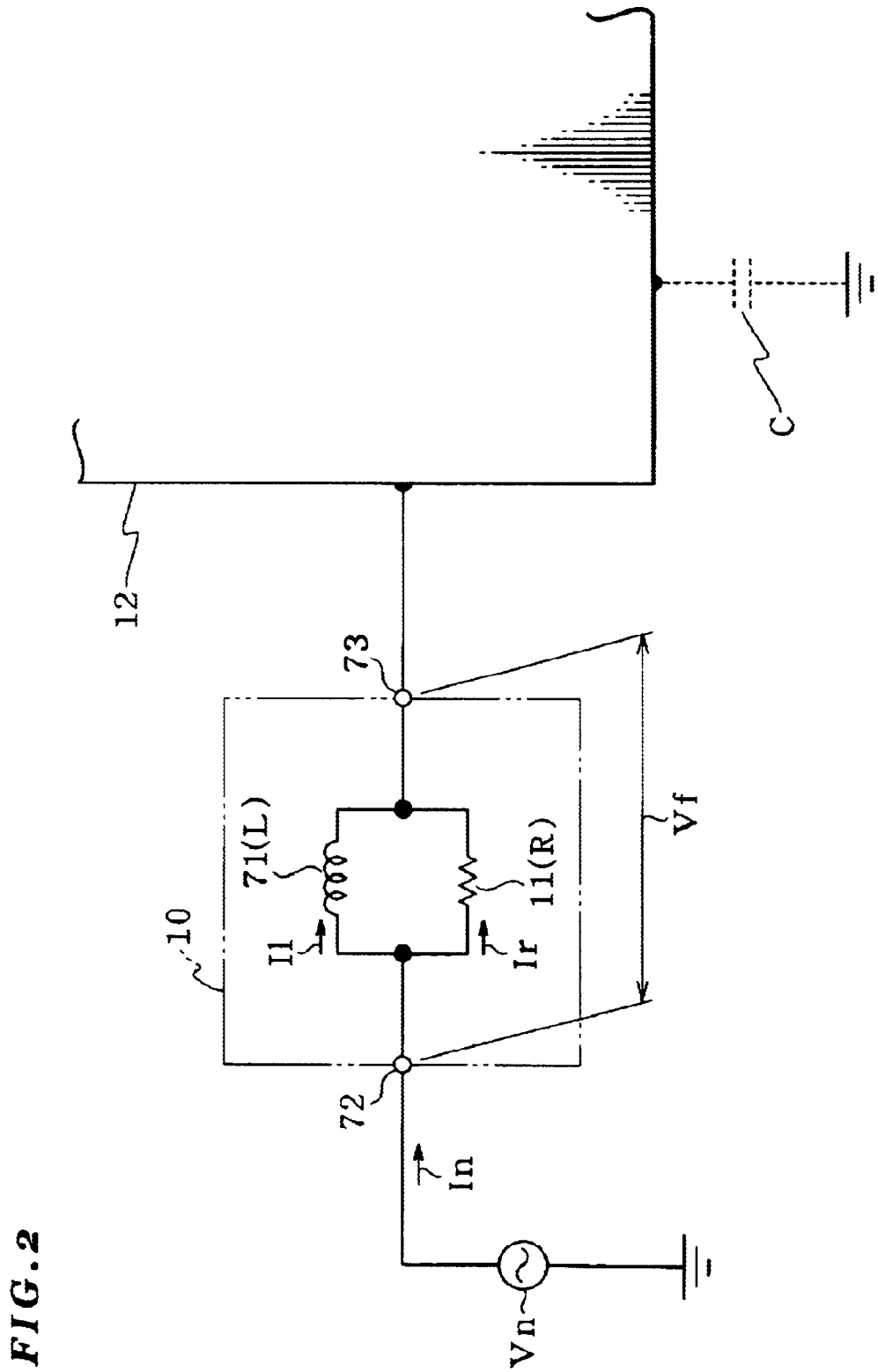
FIG. 2 is a circuit diagram for showing a state where the noise filter of FIG. 1 is used.

FIG. 1 is a circuit diagram for showing a noise filter according to a first embodiment of the present invention, and FIG. 2 is a circuit diagram for showing a state where the noise filter of FIG. 1 is used. The following will describe the present invention with reference to these figures. The same components in these figures as those in FIG. 6 are indicated by the same reference numerals and their explanation is omitted.

A noise filter 10 of this embodiment comprises an inductor 71 and a resistor 11 connected in parallel with each other. The parallel circuit comprised of the inductor 71 and the resistor 11 has its one terminal 72 connected to the ground and the other terminal 73 connected to equipment 12. As such, the noise filter 10 is a 2-terminal type one for use on a ground line.

In this parallel circuit, a power-frequency current bypasses the resistor 11 but passes through the inductor 71 with no loss. A high-frequency noise current including a resonance frequency current, on the other hand, passes not through the inductor 71 but is dissipated at the resistor 11. Therefore, the noise filter 10 does not accumulate noise power and so has no problem caused by releasing of power. A resonance frequency current caused by combination of inductance of the noise filter 10 and earth capacitance C is also dissipated at the resistor 11, thus giving no problem of this kind.

One such noise filter 10 is used on one conductor to thereby have the two terminals 72 and 73, so that it cannot use but the inductor 71. In this configuration, assuming inductance of the inductor 71 to be L and an angular frequency to be $\omega$, the reactance is $\omega L$. The reactance due to the earth capacitance C of the equipment 12, on the other hand, is $1/\omega C$, which resonates to $\omega L$ in series, thus generating a noise current.

In this embodiment, the inductor 71 is connected parallel with the resistor 11. As such, a low-frequency current such as a power supply current or a ground current in short-circuiting passes as it is through the inductor 71 with low reactance, while a noise current having a higher frequency component passes through the resistor 11 to have its power dissipated thereat.

That is, assuming resistance of the resistor 11 to be R, impedance Z of the noise filter 10 is given as follows:

$$Z=[1/\{R^2+(\omega L)^2\}]\cdot\{R(\omega L)^2+jR^2(\omega L)\} \quad (1)$$

If $\omega L \ll R$, $$Z=[1/\{1+(\omega L/R)^2\}]\cdot\{(\omega L)^2/R+j\omega L\}\approx j\omega \quad (2)$$

If $\omega L \gg R$, $$Z=[1/\{1+(R/\omega L)^2\}]\cdot\{R+jR(R/\omega L)\}\approx R \quad (3)$$

As is clear from Equation (2), since the impedance of the noise filter 10 is $Z\approx j\omega L$, the lower frequency current (power supply current) passes through the noise filter 10 with almost no loss. The high frequency current (noise current) including a resonance frequency one, on the other hand, is dissipated at the noise filter 10 because its impedance is $Z\approx R$ as is clear from Equation (3).

Assuming an angular frequency of the power supply current to be $\omega p$ [rad], a lower limit angular frequency of the noise current to be $\omega n$ [rad], inductance of the inductor 71 to be L [H], and resistance of the resistor 11 to be R[$\Omega$], the following equation must be established as is clear from Equations (2) and (3):

$$(\omega p\cdot L)\ll R\ll(\omega n\cdot L) \quad (4)$$

As for a relationship of $(\omega p\cdot L)\ll R$ on the left hand side of Equation (4), R should preferably be larger than ($\omega p\cdot L$) as much as possible. As for a relationship of $R\ll(\omega n\cdot L)$ on the right hand side of Equation (4), on the other hand, R should preferably be smaller than ($\omega n\cdot L$) as much as possible. To trade off these two relationships, preferably the following equation is established:

$$10(\omega p\cdot L)<R<(\omega n\cdot L)/10 \quad (5)$$

More preferably the following equation is established:

$$100(\omega p\cdot L)<R<(\omega n\cdot L)/100 \quad (6)$$

Most preferably the following equation is established:

$$1000(\omega p\cdot L)<R<(\omega n\cdot L)/1000 \quad (7)$$

By thus narrowing a range of the value of R, it is possible to obtain well balanced characteristics that an attenuation quantity at $\omega p$ is small appropriately and that at $\omega n$ is large appropriately.

The following will further detail an appropriate relationship among $\omega n$, L, and R with reference to FIG. 2.

A noise current In due to a noise power supply voltage Vn flows through the ground line to the side of the equipment 12, thus giving rise to a failure there. This failure of the equipment 12 can be prevented by the noise filter 10, which transforms part of the noise current In into heat at the resistor 11. If it is not significant in degree, the failure of the equipment 12 may sometimes be recovered only by dissipating a little part of the noise current In at the resistor 11. Therefore, basically the value of R is not limited.

Assuming a voltage across the noise filter 10 to be Vf, a current flowing through the inductor 71 to be I1, and a current flowing through the resistor 11 to be Ir, the following equations are given:

$$I1 = Vf/(\omega n \cdot L) \quad (8)$$

$$Ir = Vf/R \quad (9)$$

As such, a power W1 accumulated on the inductor 71 is given by:

$$W1 = L \cdot I1^2/2 = Vf^2/(2\omega n^2 \cdot L) \quad (10)$$

Then, a power Pr dissipated at the resistor 11 is given by:

$$Pr = Ir^2 \cdot R = Vf^2/R \quad (11)$$

In this case, preferably the power Pr dissipated at the resistor 11 exceeds at least the power W1 accumulated on the inductor 71, that is Pr≧W1. Therefore, the following equation is established from Equations (10) and (11):

$$W1/Pr = R/(2\omega n^2 \cdot L) \leq 1 \quad (12)$$

$$\therefore (\omega n \cdot L)/R \geq 1/(2\omega n) \quad (13)$$

It is here assumed that L=3[mH] and ωn=2π×100[rad], for example. The parameter ωn represents a second harmonic of a commercial power supply with a frequency of 50 [Hz]. In this case, the following equation is given:

$$(2\pi \times 100 \times 0.003)/R = 0.6\pi/R \geq 1/(4\pi \times 100)$$

$$\therefore R \leq 240\pi^2 \approx 2.37[k\Omega] \quad (14)$$

That is, the noise filter 10 having the resistor 11 with a value of R that satisfies Equation (14) can essentially cancel the noise which is not lower in frequency than the second harmonic of the power supply frequency.

The following will describe attenuation characteristics with reference to FIGS. 1[1], 2, and 3.

In the noise filter 10, the inductance of the inductor 71 is L=3 mH (100 turns) and the earth capacitance of the equipment 12 is C=800 pF. The resistance R of the resistor 11 is ∞ (that is there exists no resistor 11) in FIG. 3, 10 kΩ in FIG. 3, 1 kΩ in FIG. 3, and 0.1 kΩ in FIG. 3.

The noise filter of FIG. 3 has the same configuration as that of the conventional noise filter 70 (see FIG. 6), exhibiting a large drop in attenuation quantity in a region of harmonics including a resonance frequency. The noise filters of FIGS. 3[2]–3[4], on the other hand, have the same configuration as that of the noise filter 10 of this embodiment. They exhibit such characteristics that a drop in attenuation quantity decreases as R decreases from ∞ to 10 kΩ and then to 1 kΩ and is eliminated at R=0.1 kΩ.

Second Embodiment

FIG. 1 is a circuit diagram for showing the noise filter according to a second embodiment of the present invention. The following will describe with reference to FIG. 1. The same components in this figure as those in FIG. 6 are indicated by the same reference numerals and their explanation is omitted.

A noise filter 20 of this embodiment comprises a parallel circuit consisting of the inductor 81 and a resistor 21 and another parallel circuit consisting of the inductor 83 and a resistor 23, which parallel circuits are provided in series to one power supply line, and a parallel circuit consisting of the inductor 82 and a resistor 22 and another parallel circuit consisting of the inductor 84 and a resistor 24, which parallel circuits are provided in series to the other power supply line, in such a configuration that capacitors 85, 86, and 87 are connected parallel between these two power supply lines. The noise filter 20 thus provides a four-terminal noise filter for use on a power supply line. Note here that at least one of the inductor 81–84 may be provided with a resistor.

A power-frequency current bypasses the resistors 21–24 but passes through the inductors 81–84 with no loss. A high-frequency noise current including a resonance frequency current, on the other hand, passes not through the inductors 81–84 but is dissipated at the resistors 21–24. Therefore, the noise filter 20 does not accumulate noise power and so has no problem caused by releasing of power. A resonance frequency current caused by combination of inductance of the noise filter 20 and earth capacitance C is also dissipated at the resistors 21–24, thus giving no problem of this kind.

A noise current induced on a conductor such as the power supply line or the ground line supplies an unnecessary noise power to the equipment, thus causing it to fail or deteriorate in functioning. This noise current is transmitted in two transmission modes: a normal mode and a common mode. In the normal mode, noise currents flow through two conductors such as the power supply line with the same amplitude and in the opposite directions. In the common mode, noise currents flow through two conductors such as the power supply line with the same amplitude and in the same direction.

Generally, noise currents causing a failure to the equipment are given in a mutually superimposed form of these two transmission modes. Of these, the noise current given in the normal mode has been suppressed with such a four-terminal noise filter as shown in FIG. 6. Its configuration, however, has inductors and capacitors only and so has no function to decrease the noise current by dissipating it as heat. To solve this problem, the noise filter 20 of this embodiment connects the resistors 21–24 to the inductors 81–84 of the conventional four-terminal noise filter respectively in parallel with each other, thus having the function to decrease the high frequency noise current by losing it in heat. This configuration can also be expected to give almost the same effects of noise current attenuation as those by the above-mentioned two-terminal noise filter shown in FIG. 1.

Third Embodiment

FIG. 4 is a circuit diagram for showing the noise filter according to a third embodiment of the present invention. The following will describe with reference to FIG. 4. The same components in this figure as those in FIG. 1 are indicated by the same reference numerals and their explanation is omitted.

A noise filter 30 of this embodiment has replaced the resistor 11 (see FIG. 1) of the first embodiment with a variable resistor 31. As the noise filter 30 is attached to various units of equipment, they have fluctuations in value of the earth capacitance C. The resultant fluctuations in resonance frequency can also be accommodated properly by changing the resistance of the variable resistor 31.

Fourth Embodiment

FIG. 4 is a circuit diagram for showing the noise filter according to a fourth embodiment of the present invention.

The following will describe with reference to FIG. 4. The same components in this figure as those in FIG. 1 are indicated by the same reference numerals and their explanation is omitted.

A noise filter 40 of this embodiment has replaced the resistors 21–24 (see FIG. 1) of the second embodiment with variable resistors 41–44 respectively. As the noise filter 40 is attached to various units of equipment, they have fluctuations in value of the earth capacitance C. The resultant fluctuations in resonance frequency can also be accommodated properly by changing the resistance of the variable resistors 41–44. Note here that at least one of the inductors 81–84 may be provided with a variable resistor. Also, at least one of the resistors 21–24 (see FIG. 2) of the second embodiment may be replaced by a variable resistor.

Fifth Embodiment

Figure 5:
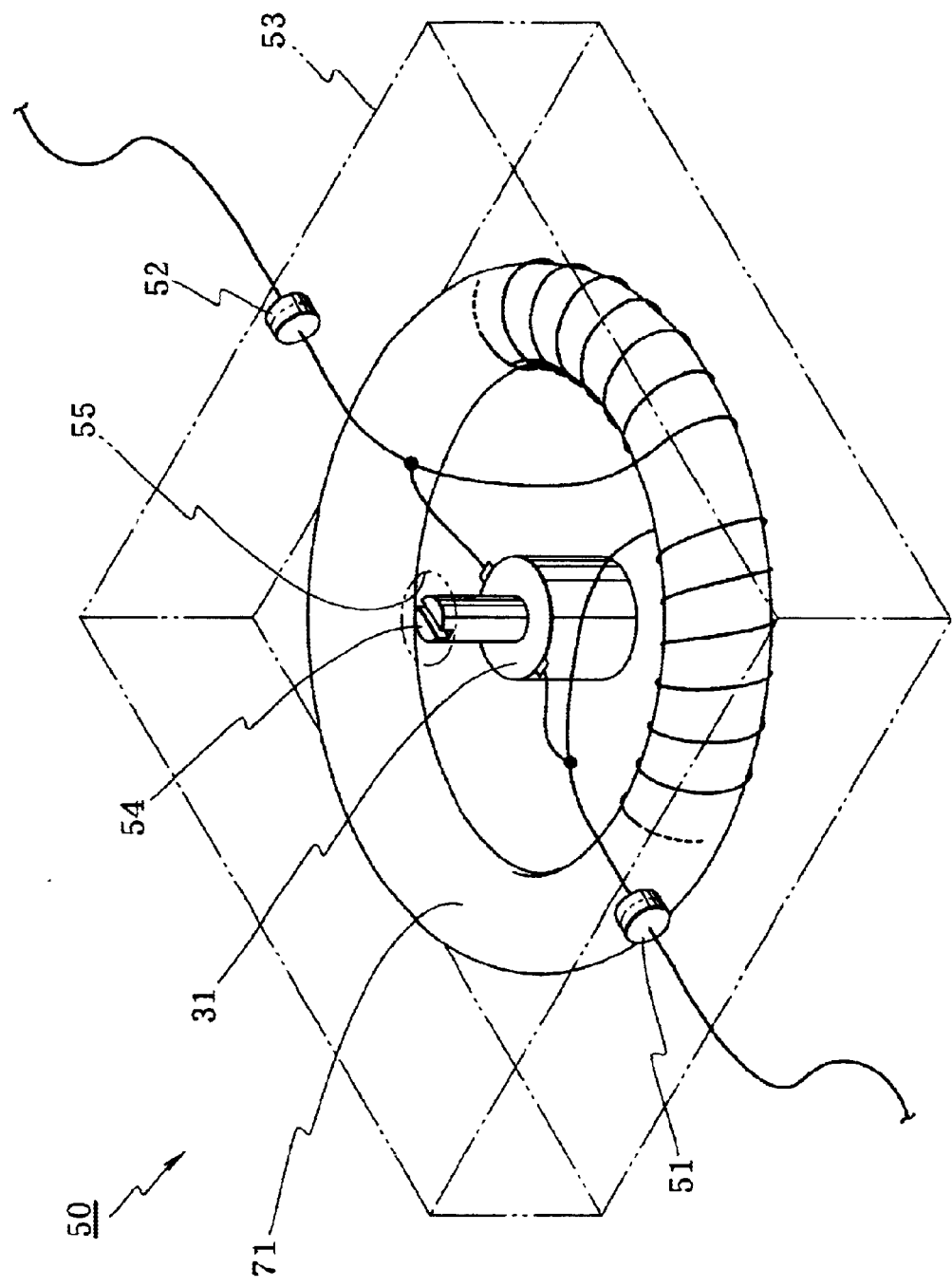
FIG. 5 is a perspective view for showing the noise filter according to a fifth embodiment of the present invention.

FIG. 5 is a perspective view for showing the noise filter according to a fifth embodiment of the present invention. The following will describe with reference to FIG. 5. This embodiment employs the same circuit as that of FIG. 4, so that the same components in FIG. 5 as those in FIG. 4 are indicated by the same reference numerals and their explanation is omitted.

A noise filter 50 of this embodiment comprises a toroidal coil 71 and a variable resistor 31 which are connected in parallel with each other. A parallel circuit consisting of the toroidal coil 71 and the variable resistor 31 has its one terminal connected through a connector 51 to the ground and the other terminal connected through a connector 52 to the equipment. The noise filter 50 thus provides a two-terminal noise filter for use on the ground line. The parallel circuit consisting of the toroidal coil 71 and the variable resistor 31 is housed in a frame 53. The frame 53 is made of, for example, metal such as aluminum or conductive plastic.

Also, the variable resistor 31 is arranged at the center of the toroidal coil 71. That is, the variable resistor 31 is housed at the center of the toroidal coil 71, to effectively utilize the space in the frame 53.

Further, a rotary shaft (resistance varying means) 54 for varying the resistance of the variable resistor 31 is disposed at such a position that it can be operated from the outside of the frame 53. In this configuration, by operating the rotary shaft from the outside of the frame 53, fluctuations in value of the earth capacitance C can be easily accommodated. Specifically, since the frame 53 is provided with a translucent hole 55 formed therein, a standard screwdriver can be inserted through it to rotate the rotary shaft 54 easily.

As the noise filter 50 is attached to various units of equipment, they have fluctuations in value of the earth capacitance C. As such, after the noise filter 50 is attached to the equipment, the rotary shaft 54 can be operated to obtain desired attenuation characteristics.

It should be appreciated that of course the present invention is not limited to the above-mentioned first through fifth embodiments. For example, the noise filter of any one of the first through fourth embodiments may be arranged in parallel with each other as many as N number and housed in one frame made of metal or nonmetal material to thereby provide a noise filter having 2N or 4N number of terminals. Here, N is two or larger integer.

The noise filter of the present invention has such a simple configuration that an inductor is connected with a resistor in parallel with each other in a conventional noise filter, so that a high frequency noise current including a resonance frequency current bypasses the inductor and is dissipated at the resistor, thus making it possible to prevent the equipment from malfunctioning due to power releasing and also suppress a resonance frequency current due to the earth capacitance of the equipment.

Also, the noise filter according to present invention, since a parallel circuit consisting of said inductor and said resistor is attached to one said ground line, with one terminal thereof connected to the ground and the other terminal thereof connected to equipment, noise filter of present invention can be used for ground line.

Also, the noise filter according to present invention, assuming an angular frequency of a power supply current to be $\omega p[rad]$, a lower limit angular frequency of a noise current to be $\omega n[rad]$, inductance of said inductor to be $L[H]$, and resistance of said resistor to be $R[\Omega]$, preferably a relationship of $10(\omega p \cdot L)<R<(\omega n \cdot L)/10$ is established, and more preferably a relationship of $100(\omega p \cdot L)<R<(\omega n \cdot L)/100$ is established, and most preferably a relationship of $1000(\omega p \cdot L)<R<(\omega n \cdot L)/1000$ is established. Accordingly, it is possible to obtain well balanced characteristics that an attenuation quantity at $\omega p$ is small appropriately and that at $\omega n$ is large appropriately.

Also, a relationship of $(\omega n \cdot L)/R \geq 1/(2\omega n)$ may be established. In this case, the power dissipated at the resistor exceeds the power accumulated on the inductor.

When the power supply line is provided more than one, the noise filter may be configured that the parallel circuit consisting of the inductor and the resistor is provided to each of the power supply lines and a capacitor is provided between the power supply lines. The noise filter of this configuration can be used for power supply line.

The resistor may be a variable resistor. As the noise filter is attached to various units of equipment, they have fluctuations in value of the earth capacitance. The resultant fluctuations in resonance frequency can also be accommodated properly by changing the resistance of the variable resistors.

The noise filter may have a configuration that a resistance varying means for varying resistance of the variable resistor is provided at such a position as to be able to be operated from an outside of the frame. Accordingly, by operating the resistance varying means from the outside of the frame, fluctuations in value of the earth capacitance can be easily accommodated. Further, the variable resistor is arranged in a space surrounded by an inner peripheral wall of the toroidal coil, thus the space in the frame can be utilized effectively. Accordingly, miniaturization and lightening of the noise filter can be achieved.

The invention may be embodied in other specific forms without departing from the spirit or essential characteristic thereof. The present embodiments are therefore to be considered in all respects as illustrative and not restrictive, the scope of the invention being indicated by the appended Claims rather than by the foregoing description and all changes which come within the meaning and range of equivalency of the Claims are therefore intended to be embraced therein.

The entire disclosure of Japanese Patent Application No. 2001-391303 (Filed on Dec. 25, 2001) including specification, Claims, drawings and summary are incorporated herein by reference in its entirety.

What is claimed is:

1. A filter that suppresses noise induced on an electronic component, comprising:
   an inductive apparatus; and
   a resistive apparatus connected in parallel with said inductive apparatus to suppress a resonant frequency current that arises by a series resonance of an earth capacitance formed between the electronic component, an electrical ground, and said inductor.

2. A filter that suppresses noise induced on an electronic component, comprising: an inductive apparatus; and
  a variable resistive apparatus connected in parallel with said inductive apparatus to suppress a resonant frequency current associated with the electronic component, a resistance of said variable resistive apparatus being adjustable to vary said suppression of resonant frequency current;
  wherein said inductive apparatus and said variable resistive apparatus are housed in a frame, said variable resistive apparatus being positioned is said frame such that said resistance of said variable resistive apparatus is adjustable from outside of the frame;
  wherein said inductive apparatus comprises a toroidal coil, said variable resistive apparatus being arranged at a center of said toroidal coil.

3. The filter of claim 2, wherein a lower limit angular frequency of a noise current is $\omega n[rad]$, an inductance of said inductive apparatus is $L[H]$, and a resistance of said variable resistive apparatus is $R[\Omega]$, such that a following relationship is established:

$$(\omega n \cdot L)/R \geq 1/(2\omega n).$$

4. The filter of claim 2, wherein an angular frequency of a power supply current is $\omega p[rad]$, a lower limit angular frequency of a noise current is $\omega n[rad]$, an inductance of said inductive apparatus is $L[H]$, and a resistance of said variable resistive apparatus is $R[\Omega]$, such that a following relationship is established:

$$10(\omega p \cdot L) < R < (\omega n \cdot L)/10.$$

5. The filter of claim 2, wherein an angular frequency of a power supply current is $\omega p[rad]$, a lower limit angular frequency of a noise current is $\omega n[rad]$, an inductance of said inductive apparatus is $L[H]$, and a resistance of said variable resistive apparatus is $R[\Omega]$, such that a following relationship is established:

$$100(\omega p \cdot L) < R < (\omega n \cdot L)/100.$$

6. The filter of claim 2, wherein an angular frequency of a power supply current is $\omega p[rad]$, a lower limit angular frequency of a noise current is $\omega n[rad]$, an inductance of said inductive apparatus is $L[H]$, and a resistance of said variable resistive apparatus is $R[\Omega]$, such that a following relationship is established:

$$1000(\omega p \cdot L) < R < (\omega n \cdot L)/1000.$$

7. The filter of claim 2, wherein a lower limit angular frequency of a power current is $\omega n[rad]$, an inductance of said inductive apparatus is $L[H]$, and a resistance of said variable resistive apparatus is $R[\Omega]$, such that a following relationship is established:

$$(\omega n \cdot L)/R \geq 1/(2\omega n).$$

8. A filter that suppresses noise, comprising:
  a ground line that is connected to equipment;
  an inductor that suppresses noise induced on the ground line that flows to the equipment; and
  a resistor connected in parallel with the inductor, wherein said resistor suppresses a resonant frequency current caused by a series resonance of an earth capacitance between the equipment and ground and said inductor, said resistor consuming electric power accumulated in the inductor.

9. The filter of claim 8, wherein said inductor comprises a toroidal coil, said resistor comprises a variable resistor, said toroidal coil and said variable resistor being arranged to form a parallel circuit housed in a frame, said variable resistor being arranged in a space surrounded by an inner peripheral wall of said toroidal coil, a resistance varier being provided at a predetermined position to vary a resistance of said variable resistor.

10. The filter of claim 9, wherein said predetermined position of said resistance varier comprises a position that enables said resistance of said variable resistor to be varied outside of said frame.

11. An electronic device comprising the noise filter of claim 8.

12. The filter of claim 8, wherein a lower limit angular frequency of a noise current is $\omega n[rad]$, an inductance of said inductor is $L[H]$, and a resistance of said resistor is $R[\Omega]$, such that a following relationship is established:

$$(\omega n \cdot L)/R \geq 1/(2\omega n).$$

13. The filter of claim 8, wherein said resistor comprises a variable resistor when said ground line grounds plural equipment having different earth capacitances.

14. The filter of claim 8, wherein an angular frequency of a power supply current is $\omega p[rad]$, a lower limit angular frequency of a noise current is $\omega n[rad]$, an inductance of said inductor is $L[H]$, and a resistance of said resistor is $R[\Omega]$, such that a following relationship is established:

$$10(\omega p \cdot L) < R < (\omega n \cdot L)/10.$$

15. The filter of claim 8, wherein an angular frequency of a power supply current is $\omega p[rad]$, a lower limit angular frequency of a noise current is $\omega n[rad]$, an inductance of said inductor is $L[H]$, and a resistance of said resistor is $R[\Omega]$, such that a following relationship is established:

$$100(\omega p \cdot L) < R < (\omega n \cdot L)/100.$$

16. The filter of claim 8, wherein an angular frequency of a power supply current is $\omega p[rad]$, a lower limit angular frequency of a noise current is $\omega n[rad]$, an inductance of said inductor is $L[H]$, and a resistance of said resistor is $R[\Omega]$, such that a following relationship is established:

$$1000(\omega p \cdot L) < R < (\omega n \cdot L)/1000.$$

17. The filter of claim 8, wherein a lower limit angular frequency of a noise current is $\omega n[rad]$, an inductance of said inductor is $L[H]$, and a resistance of said resistor is $R[\Omega]$, such that a following relationship is established:

$$(\omega n \cdot L)/R \geq 1/(2\omega n).$$

* * * * *

UNITED STATES PATENT AND TRADEMARK OFFICE
CERTIFICATE OF CORRECTION

| | |
|---|---|
| PATENT NO. | : 6,801,103 B2 |
| APPLICATION NO. | : 10/197561 |
| DATED | : October 5, 2004 |
| INVENTOR(S) | : T. Terakawa et al. |

It is certified that error appears in the above-identified patent and that said Letters Patent is hereby corrected as shown below:

At column 9, line 11 (claim 2, line 11) of the printed patent, "is" should be --in--.

At column 9, line 52 (claim 7, line 2) of the printed patent, "power" should be --noise--.

Signed and Sealed this

Twenty-fourth Day of April, 2007

JON W. DUDAS
*Director of the United States Patent and Trademark Office*